United States Patent
Polomoff et al.

(10) Patent No.: US 11,105,846 B1
(45) Date of Patent: Aug. 31, 2021

(54) CRACK DETECTING AND MONITORING SYSTEM FOR AN INTEGRATED CIRCUIT

(71) Applicant: GLOBALFOUNDRIES U.S. Inc., Santa Clara, CA (US)

(72) Inventors: Nicholas A. Polomoff, Hopewell Junction, NY (US); Dirk Breuer, Dresden (DE); Eric D. Hunt-Schroeder, Essex Junction, VT (US); Bernhard J Wunder, Westford, VT (US); Dewei Xu, Clifton Park, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/838,439

(22) Filed: Apr. 2, 2020

(51) Int. Cl.
  *G01R 31/28* (2006.01)
(52) U.S. Cl.
  CPC ................ *G01R 31/2884* (2013.01)
(58) Field of Classification Search
  CPC .................................................. G01R 31/2884
  USPC ........................................ 324/522, 512, 500
  See application file for complete search history.

(56) References Cited

U.S. PATENT DOCUMENTS

| | | |
|---|---|---|
| 6,649,986 B1 | 11/2003 | Ishizaki et al. |
| 7,491,578 B1 | 2/2009 | Shaw et al. |
| 7,649,200 B1 | 1/2010 | Miller et al. |
| 9,070,683 B2 | 6/2015 | Fender et al. |
| 9,287,184 B2 | 3/2016 | Dennison et al. |
| 9,646,897 B2 | 5/2017 | Sanchez et al. |
| 9,698,066 B2 | 7/2017 | Lee et al. |
| 9,768,129 B2 | 9/2017 | Lee et al. |
| 2002/0024115 A1 | 2/2002 | Ibnabdeljalil et al. |
| 2010/0109128 A1 | 5/2010 | West et al. |
| 2011/0068435 A1 | 3/2011 | Hudson |
| 2013/0009663 A1 | 1/2013 | Gauch et al. |
| 2017/0323835 A1* | 11/2017 | Ogawa .................... H01L 21/78 |
| 2019/0250208 A1* | 8/2019 | Dhanasekaran ... G01R 31/2856 |
| 2019/0353697 A1* | 11/2019 | Kesselring .......... H01L 23/5223 |
| 2020/0090566 A1* | 3/2020 | Lee ........................ G09G 3/006 |
| 2020/0103462 A1* | 4/2020 | Periyannan .......... G11C 29/006 |
| 2020/0203236 A1* | 6/2020 | Lee .................... G01R 31/2884 |

* cited by examiner

*Primary Examiner* — Giovanni Astacio-Oquendo
(74) *Attorney, Agent, or Firm* — Anthony Canale; Hoffman Warnick LLC

(57) ABSTRACT

Embodiments of the disclosure provide a system for detecting and monitoring a crack in an integrated circuit (IC), including: at least one electrically conductive perimeter line (PLINE) extending about, and electrically isolated from, a protective structure formed in an inactive region of the IC, wherein an active region of the IC is enclosed within the protective structure; a circuit for sensing a change in an electrical characteristic of the at least one PLINE, the change in the electrical characteristic indicating a presence of a crack in the inactive region of the IC; and a connecting structure for electrically coupling each PLINE to the sensing circuit.

20 Claims, 14 Drawing Sheets

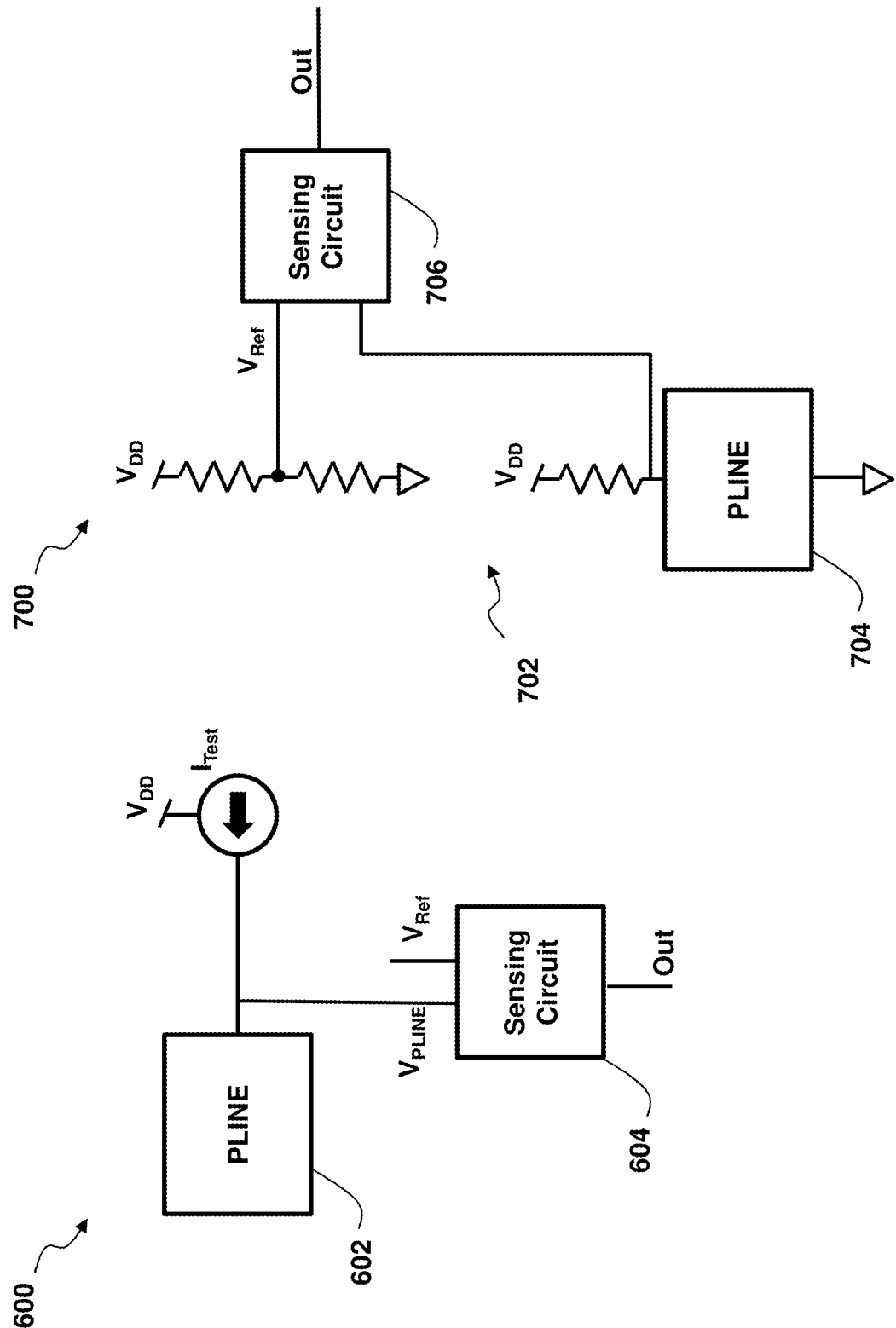

CRACK DETECTING AND MONITORING SYSTEM FOR AN INTEGRATED CIRCUIT

BACKGROUND

The present disclosure relates to integrated circuits, and more specifically, to a system for detecting and monitoring the growth of cracks in an integrated circuit (IC).

Processes, such as the dicing of wafers, may result in the formation and propagation of cracks in an IC. Such cracks often form at interfaces between dielectric materials and metal lines/contacts in the IC.

ICs are often exposed to harsh, hostile, and stressful environments (e.g., automotive, aerospace, military, etc.). Fluctuations in environmental conditions (e.g., temperature, humidity, and barometric changes) may exacerbate and activate slow crack growth mechanisms upon nascent and dormant cracks (e.g., cracks formed during dicing of a wafer) in the ICs. Continual oscillation of the environmental conditions may enhance the growth of nascent and dormant cracks over time, potentially leading to IC failure.

Crackstops (e.g., an interconnected structure of metal lines and vias) have been fabricated and employed to block cracks from propagating into an active region of an IC. Such crackstops are generally formed around the periphery of the IC and surround the inner core (active area) of the IC.

Although effective, crackstops may not always be able to prevent a crack from propagating into the active region of an IC. To this extent, crack detecting structures, placed in the active region of an IC inside of the crackstop, have been developed to detect the presence of a crack that has propagated past the crackstop into the active region of the IC chip. However, such crack detecting structures are inherently flawed as they are designed to detect a crack after it is too late and the crack has already reached the active region of the IC chip.

SUMMARY

An aspect of the disclosure is directed to a system for detecting and monitoring a crack in an integrated circuit (IC), including: at least one electrically conductive perimeter line (PLINE) extending about, and electrically isolated from, a protective structure formed in an inactive region of the IC, wherein an active region of the IC is enclosed within the protective structure; a circuit for sensing a change in an electrical characteristic of the at least one PLINE, the change in the electrical characteristic indicating a presence of a crack in the inactive region of the IC; and a connecting structure for electrically coupling each PLINE to the sensing circuit.

Another aspect of the disclosure is directed to a method for detecting and monitoring a crack in an integrated circuit (IC), including: forming at least one electrically conductive perimeter line (PLINE) around a protective structure formed in an inactive region of the IC, wherein an active region of the IC is enclosed within the protective structure; monitoring an electrical characteristic of the at least one PLINE, wherein a change in the electrical characteristic indicates a presence of a crack in the inactive region of the IC; and providing an early warning alert in response to the sensed change in the electrical characteristic of the at least one PLINE, wherein the early warning alert is provided before the crack has propagated into the active region of the IC.

Another aspect of the disclosure is directed to a system for detecting and monitoring a crack in an integrated circuit (IC), including: at least one electrically conductive perimeter line (PLINE) extending about, and electrically isolated from, a protective structure formed in an inactive region of the IC, wherein an active region of the IC is enclosed within the protective structure; a circuit for sensing a change in an electrical characteristic of the at least one PLINE, the change in the electrical characteristic indicating a presence of a crack in the inactive region of the IC; and a connecting structure for electrically coupling each PLINE to the sensing circuit, wherein the connecting structure further includes at least one of: a metal straddling connector extending over, and electrically isolated from, the protective structure of the IC; and a doped semiconductor tunneling connector extending under, and electrically isolated from, the protective structure of the IC.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements.

FIG. 14 depicts a detection and monitoring circuit according to embodiments.

FIG. 15 depicts a detection and monitoring circuit according to additional embodiments.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Figure 1:
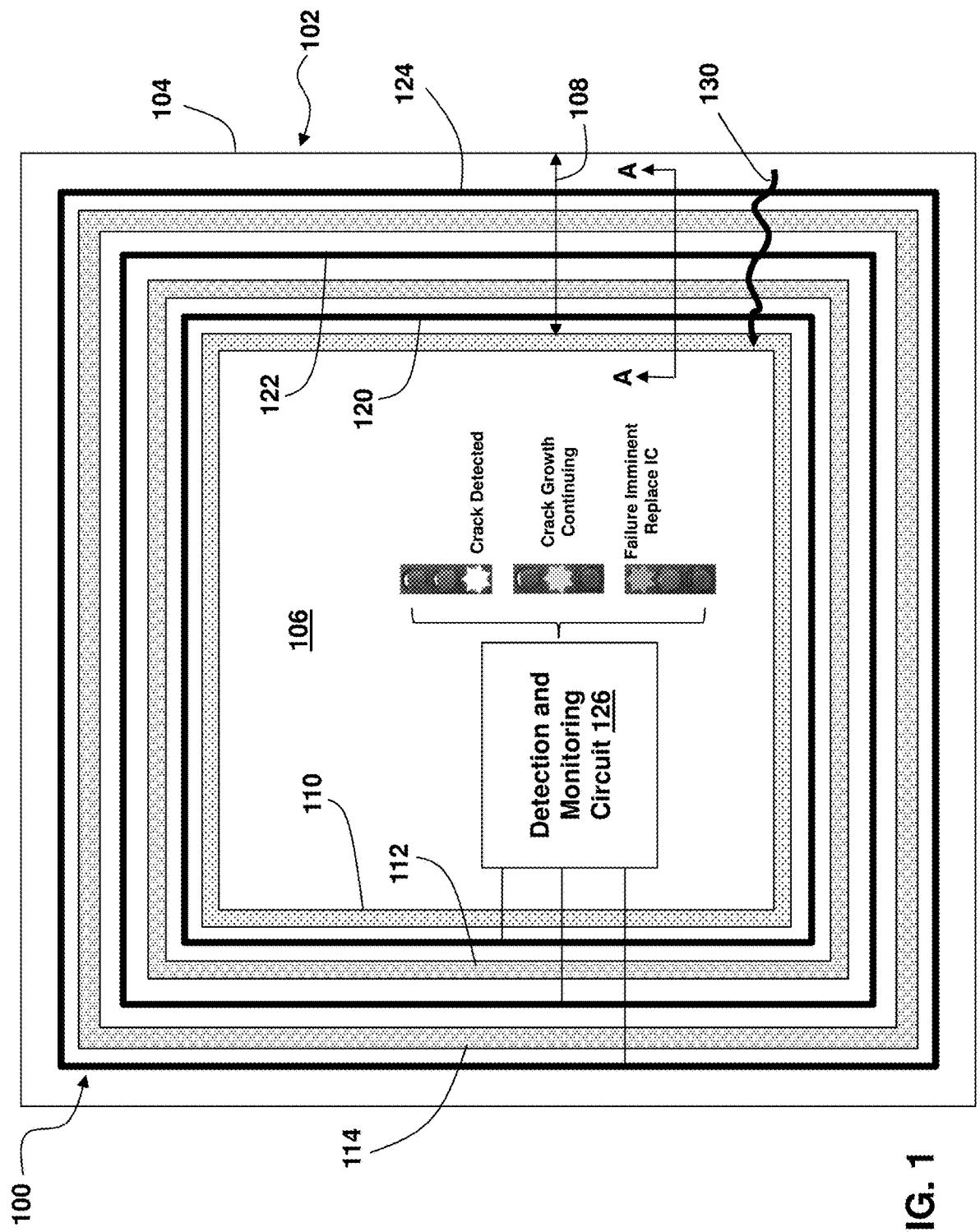
FIG. 1 depicts a plan view of an integrated circuit (IC) including a system for detecting and monitoring the growth of cracks according to embodiments.

FIG. 1 depicts a plan view of an integrated circuit (IC) 102 including a crack detecting and monitoring system 100 for detecting and monitoring the growth of cracks according to embodiments. The IC 102 is formed on a semiconductor substrate 104 (e.g., a silicon wafer) and includes an inner core (hereafter active region 106) surrounded by and isolated from an inactive region 108 by a guard ring 110 and at least one crackstop 112, 114. The active region 106 typically includes a plurality of active and passive components (e.g., transistors, resistors, etc.). The guard ring 110 and crackstops 112, 114 provide environmental, electrical (e.g., the guard ring provides electrical ground), and/or mechanical protection for the active region 106 of the IC 102. For example, the crackstops 112, 114 may be employed to block cracks from propagating from the inactive region 108 of the IC 102 into the active region 106 of the IC 102. The guard ring 110 and crackstops 112, 114 may be conventional in nature and may be provided using any now known or later developed processes/technologies.

According to embodiments, the crack detecting and monitoring system 100 is configured to detect and monitor the growth of one or more cracks in the inactive region 108 of the IC 102—before any cracks propagate into the active region 106 of the IC 102. In general, as depicted in FIG. 1, the crack detecting and monitoring system 100 may include at least one electrically conductive perimeter line (PLINE) formed in the inactive region 108 of the IC 102. For example, a first PLINE 120, second PLINE 122, and third PLINE 124 may be formed in the inactive region 108 of the IC 102. In this example, as shown in FIG. 1, first PLINE 120 may be formed about an outer periphery of the guard ring 110, between the guard ring 110 and the crackstop 112. Second PLINE 122 may be formed about an outer periphery of the crackstop 112, between the crackstop 112 and the crackstop 114. Third PLINE 124 may be formed about an outer periphery of the crackstop 114. Although three PLINEs 120, 122, 124 are utilized in this embodiment, it should be evident that the crack detecting and monitoring system 100 may include a larger or smaller number of PLINEs (e.g., one or more). In addition, PLINEs may be formed in other locations in the inactive region 108 of the IC 102, and/or a plurality of PLINEs may be formed adjacent to one another in the inactive region 108 of the IC 102. Various other embodiments depicting such placements of PLINEs are described herein.

Each PLINE 120, 122, 124 is independently coupled to a detection and monitoring circuit 126. The functionality of the detection and monitoring circuit 126 in this embodiment and other embodiments may be provided by the IC 102 as shown or via an external circuit (not shown). According to embodiments, connections may be provided over and/or under one or more of the guard ring 110, crackstop 112, and crackstop 114 to couple PLINEs 120, 122, 124 to the detection and monitoring circuit 126. To this extent, depending upon embodiments, the integrity of the guard ring 110, crackstop 112, and crackstop 114 is not compromised or is minimally compromised by the connections (e.g., no holes are formed in or through the guard ring 110, crackstop 112, or crackstop 114).

The detection and monitoring circuit 126 is configured to sense a change in an electrical characteristic (e.g., resistance) of each independent PLINE 120, 122, 124, where the change in the electrical characteristic indicates the presence of a crack at PLINE 120, 122, 124. The detection and monitoring circuit 126 may also be configured to monitor the progression of a detected crack through the inactive region 108 of the IC 102 and to alert an end user of a status and/or threat level of the detected crack (e.g., impending crack breach into the active region 106 of the IC 102). For example, if a crack 130 (e.g., formed when dicing the silicon wafer including the IC 102) propagates to, and forms a break in/through, PLINE 124, the detection and monitoring circuit 126 may detect an increase (e.g., by orders of magnitude) in the resistance of PLINE 124 (e.g., due to the presence of an open circuit in PLINE 124). To this extent, the detection and monitoring circuit 126 may inform an end user that a crack breach into/through PLINE 124 has occurred and to be on alert. If the crack 130 continues to propagate through the inactive region 108 of the IC 102 past the crackstop 114, and forms a break in/through PLINE 122, the detection and monitoring circuit 126 may detect an increase in the resistance of PLINE 122 and may inform an end user that growth of the crack 130 is continuing. In addition, the detection and monitoring circuit 126 may inform the end user that the IC 102 should be replaced in an approximate amount of time (e.g., 12 months) days to avoid a failure of the IC 102. If the crack 130 propagates through and past the crackstop 112 and into/through PLINE 120, the detection and monitoring circuit 126 may detect an increase in the resistance of PLINE 120 and may inform the end user that a failure of the IC 102 is imminent and that the IC 102 should be immediately replaced.

As described above, and depicted in FIG. 1, the crack detecting and monitoring system 100 may be configured to provide early, intermediate, and final warnings of an impending crack breach into the active region 106 of the IC 102. In other embodiments, the crack detecting and monitoring system can be configured to provide aging information. For example, the crack detecting and monitoring system 100 can be calibrated such that an approximate time to failure of an IC 102 can be determined. For instance, in a stable operating environment, the growth rate of a crack in a test IC 102 can be determined/estimated (e.g., X microns a year). Based on the growth rate, PLINEs 120, 122. 124 can be spaced at specific distances from the active region 106 of the IC 102, where the distances correspond to different remaining operational lifetimes of the IC 102. When a crack propagates into/through a given PLINE, the detection and monitoring circuit 126 may alert an end user that a crack has reached that PLINE and that if conditions remain stable, the crack may reach another location on the IC 102 (e.g., the active region 106 of the IC 102) in a certain amount of time. Such an alert may include, for example, "A crack has reached PLINE A, located B microns from the active region of the chip. If conditions remain stable, the crack may reach the active area of the IC in approximately 16 months. To avoid failure, replace the IC within 12 months."

Figure 2:
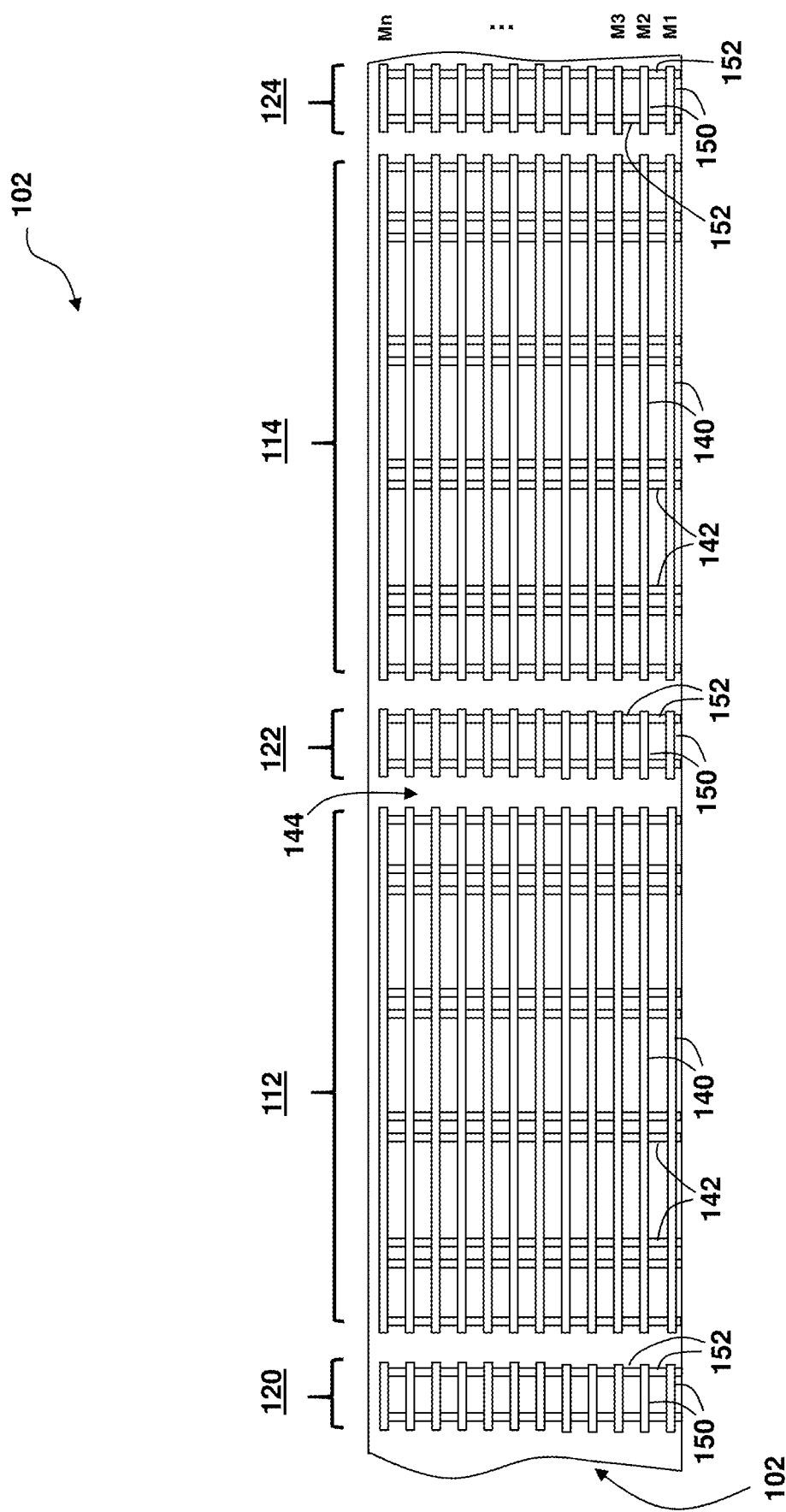
FIG. 2 depicts a cross-sectional view of the IC of FIG. 1 taken along line A-A according to embodiments.

FIG. 2 depicts a partial cross-sectional view of the IC 102 of FIG. 1 taken along line A-A according to embodiments. As shown, the crackstops 112, 114 may be formed using a plurality of layers of metal segments 140 interconnected by a plurality of metal interconnects 142 (e.g., vias, viabars, etc.) and embedded in a dielectric material 144. The metal segments 140 may be formed in metallization layers M1, M2, Mn of the IC 102 (e.g., back end of line (BEOL) metallization layers). The crackstops 112, 114 may have a similar configuration as depicted in FIG. 2 or may include different configurations of metal segments 140 and/or metal interconnects 142 (e.g., the numbers, shapes, spacings, dimensions, etc. of the metal segments 140 and metal interconnects 142 may vary between the crackstops 112, 114).

Each PLINE 120, 122, 124 may include a plurality of layers of electrically conductive metal segments 150 interconnected by a plurality of electrically conductive metal interconnects 152 (e.g., vias, viabars, etc.) and embedded in the dielectric material 144. PLINEs 120, 122, 124 (and other PLINES disclosed herein) may be formed during the same processing steps as the crackstops 112, 114 and may formed of any suitable metal including, for example, copper, tungsten, aluminum, silver, gold, other metals, or alloys thereof. The metal segments 150 may also be formed in metallization layers M1, M2, M3, Mn of the IC 102. As with the crackstops 112, 114, PLINEs 120, 122, 124 may have similar or different configurations of metal segments 150 and/or metal interconnects 152 (e.g., the numbers, shapes, spacings, dimensions, etc. of the metal segments 150 and metal interconnects 152 may vary between PLINEs 120, 122, 124).

Figure 3:
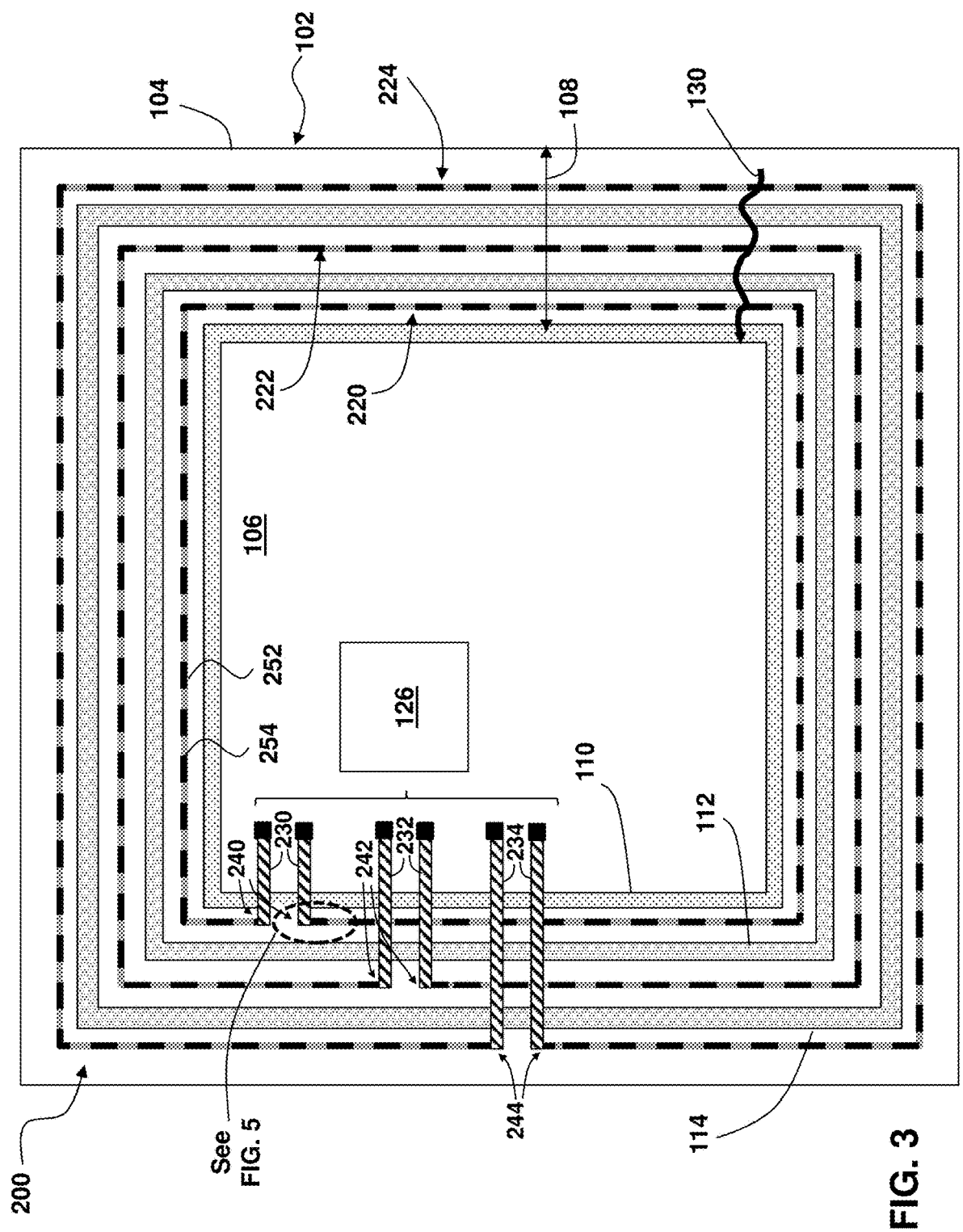
FIG. 3 depicts a plan view of an IC including a system for detecting and monitoring the growth of cracks according to embodiments, where the crack detecting and monitoring system includes perimeter lines (PLINEs) and straddling connections.
Figure 4:
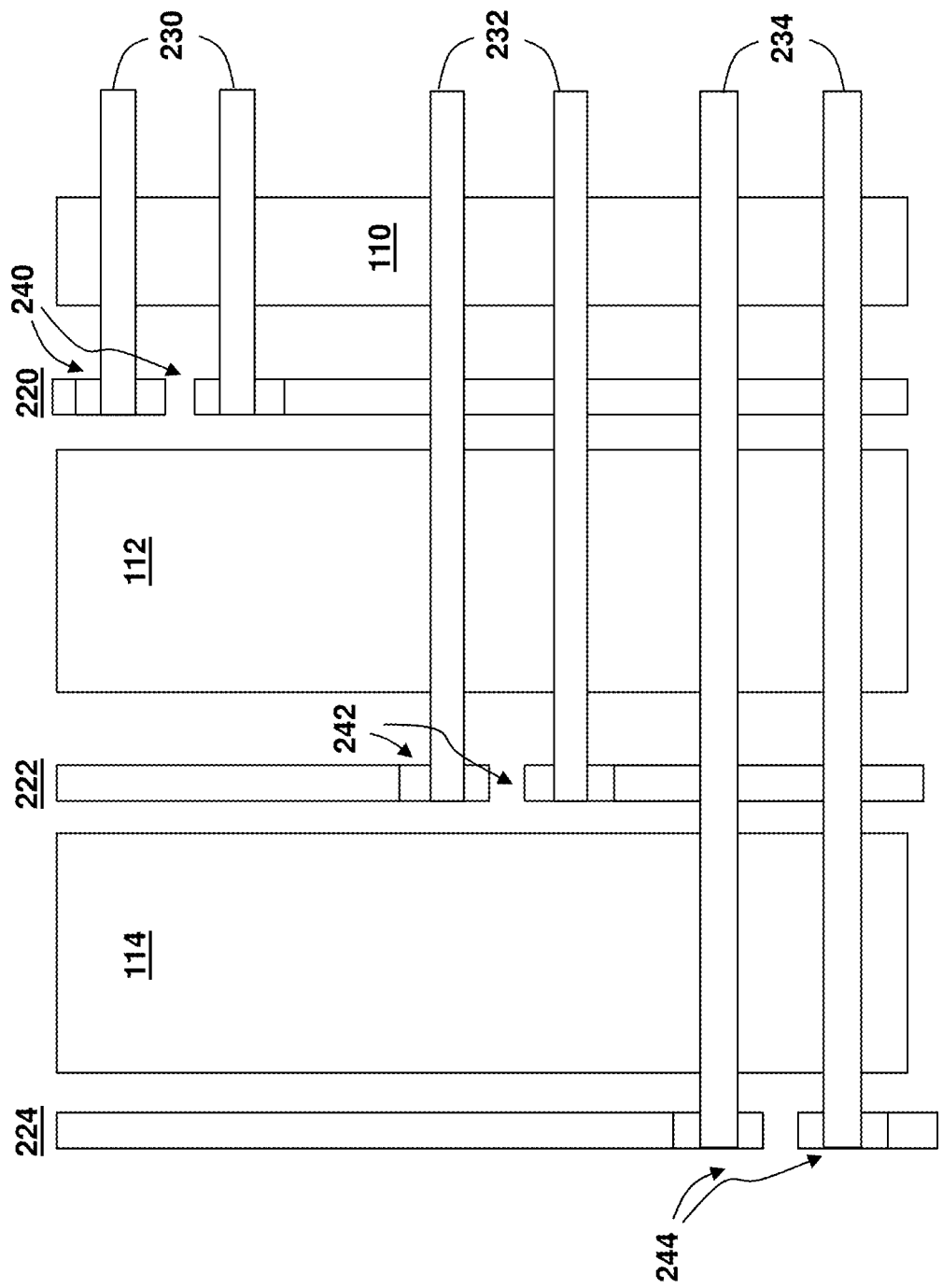
FIG. 4 depicts an enlarged, partial plan view of the IC of FIG. 3 according to embodiments.
Figure 5:
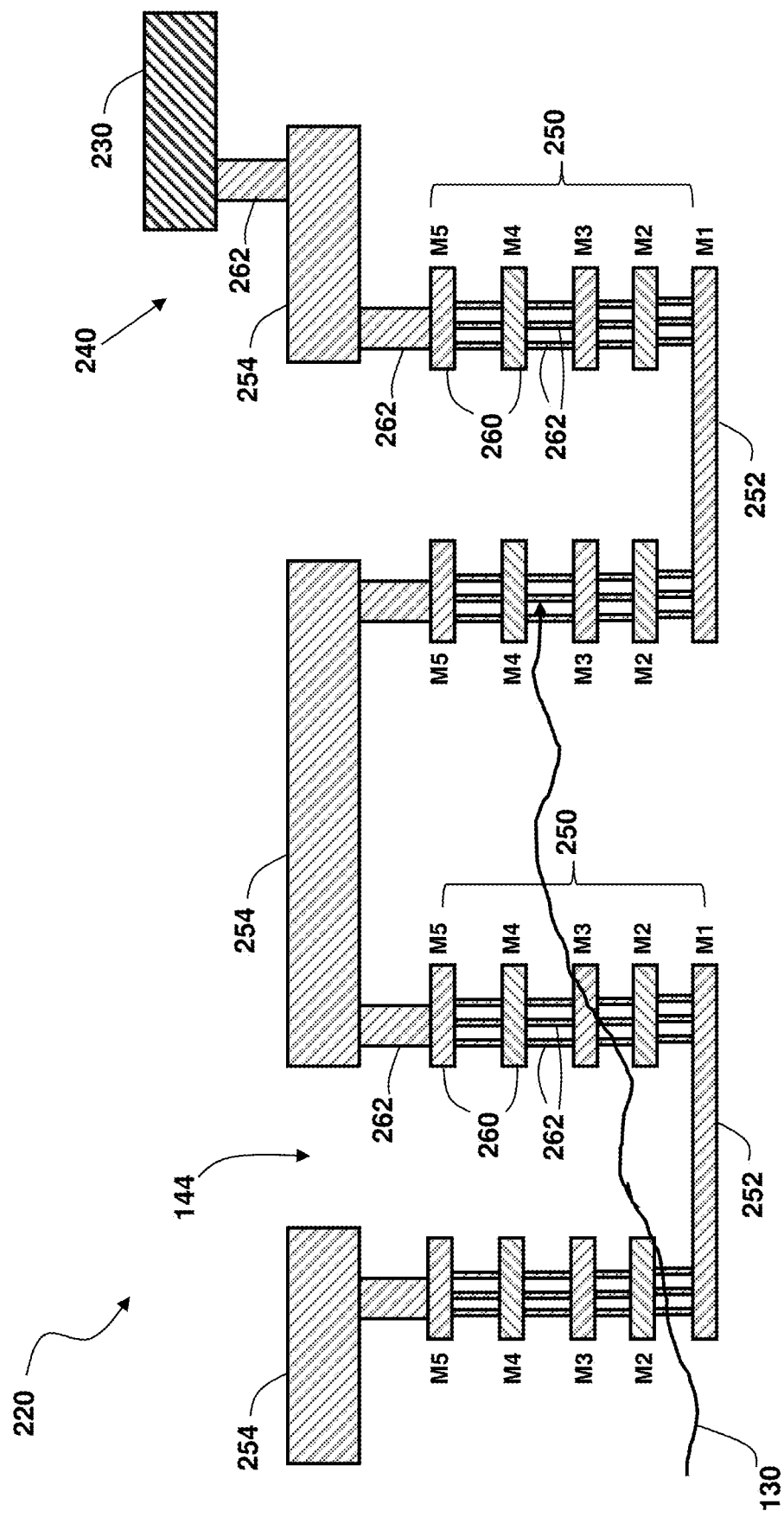
FIG. 5 depicts a partial cross-sectional view of a PLINE in the IC of FIG. 3 according to embodiments.

According to embodiments, PLINEs may be coupled to the detection and monitoring circuit 126 via connections that extend over (e.g., straddling connections) or under (e.g., tunneling connections) one or more of the guard ring 110, crackstop 112, and crackstop 114. For example, an IC 102 including a crack detecting and monitoring system 200 with electrically conductive PLINEs 220, 222, 224 and electrically conductive straddling metal connections 230, 232, 234 according to embodiments is depicted in FIGS. 3-5, referred to concurrently. FIG. 3 depicts a plan view of the IC 102. FIG. 4 depicts a partial, enlarged plan view of the IC of FIG. 3. FIG. 5 depicts a partial cross-sectional view along a length of a PLINE (e.g., PLINE 220 in FIG. 3). Although three PLINEs 220, 222, 224 are utilized in this embodiment, it should be evident that the crack detecting and monitoring system 200 may include a larger or smaller number of PLINEs (e.g., one or more). In addition, PLINEs may be formed in other locations in the inactive region 108 of the IC 102, and/or a plurality of PLINEs may be formed adjacent to one another in the inactive region 108 of the IC 102.

Similar to the crack detecting and monitoring system 100 depicted in FIG. 1, the crack detecting and monitoring system 200 is configured to detect and monitor the growth of one or more cracks 130 in the inactive region 108 of the IC 102, before any cracks propagate into the active region 106 of the IC 102. In general, the crack detecting and monitoring system 200 may include at least one PLINE formed in the inactive region 108 of the IC 102. For example, as shown in FIG. 3, a first PLINE 220, second PLINE 222, and third PLINE 224 may be formed in the inactive region 108 of the IC 102 and may be independently coupled to the detection and monitoring circuit by respective straddling connections.

First PLINE 220 may be formed about an outer periphery of the guard ring 110, between the guard ring 110 and the crackstop 112. Second PLINE 222 may be formed about an outer periphery of the crackstop 112, between the crackstop 112 and the crackstop 114. Third PLINE 224 may be formed about an outer periphery of the crackstop 114. Opposing ends 240 of first PLINE 220 may be coupled via straddling metal connections 230 to the detection and monitoring circuit 126. The straddling metal connections 230 may extend over, and may be electrically isolated from, the guard ring 110. Opposing ends 242 of second PLINE 222 may be coupled via straddling metal connections 232 to the detection and monitoring circuit 126. As shown, the straddling metal connections 232 may extend over, and may be electrically isolated from, the crackstop 112, PLINE 220, and the guard ring 110. Opposing ends 244 of third PLINE 224 may be coupled via straddling metal connections 234 to the detection and monitoring circuit 126. The straddling metal connections 234 may extend over, and may be electrically isolated from, the crackstop 114, the crackstop 112, PLINE 222, PLINE 220, and the guard ring 110. Electrical isolation can be provided, for example, using one or more layers of a dielectric material 144 and/or the like.

A cross-sectional view along an end of portion PLINE 220 in FIG. 3 according to embodiments is depicted in FIG. 5. PLINEs 222 and 224 may each have a similar or different configuration than PLINE 220. As shown, PLINE 220 may include a plurality of electrically conductive metal sections 250 that may be daisy-chained (e.g., stitched) together by an alternating sequence of lower and upper electrically conductive metal connectors 252, 254. The metal connectors 252, 254 may have similar or different lengths. The lengths of the metal connectors 252, 254 may affect the crack detection accuracy of PLINE 220. For example, a larger number (e.g., higher density) of metal sections 250 may be daisy-chained together when using shorter metal connectors 252, 254. In general, the minimum lengths of the metal connectors 252, 254 may be governed by the processing rules used to form the IC 102. For example, the lithography tools used to fabricate the metal connectors 252, 254 in respective metallization layers of the IC 102 may only be capable of producing metal lines having a certain minimum length in a particular dielectric layer.

According to embodiments, the lower metal connectors 252 may be formed, for example, in a lower BEOL metallization layer of the IC 102 (e.g., M1 metallization layer as shown). The upper metal connectors 254 may be formed in an upper metallization layer of the IC 102. According to embodiments, the lengths of the metal connectors 252, 254 may be, for example, in the range of tens of nanometers to several microns (e.g., depending on manufacturing limitations and/or other factors). As shown in FIG. 5, a crack 130 propagating into/through PLINE 220 may form a break in/through one or more of the metal sections 250, which may be sensed (e.g., as an increase in resistance of PLINE 220) by the detection and monitoring circuit 126.

The metal sections 250 may include a plurality of layers of electrically conductive metal segments 260 interconnected using a plurality of electrically conductive metal interconnects 262 (e.g., vias, viabars, etc.) and embedded in a dielectric material 144. The metal segments 262 may be formed in metallization layers of the IC 102 (e.g., metallization layers M2-M5 as shown). One or more metal interconnects 262 may also be used to couple the metal sections 250 to respective lower and upper metal connectors 252, 254. The upper metal connector 254 located at an end 240 of PLINE 220 may be coupled by a metal interconnect 262 to a straddling metal connection 230.

Figure 6:
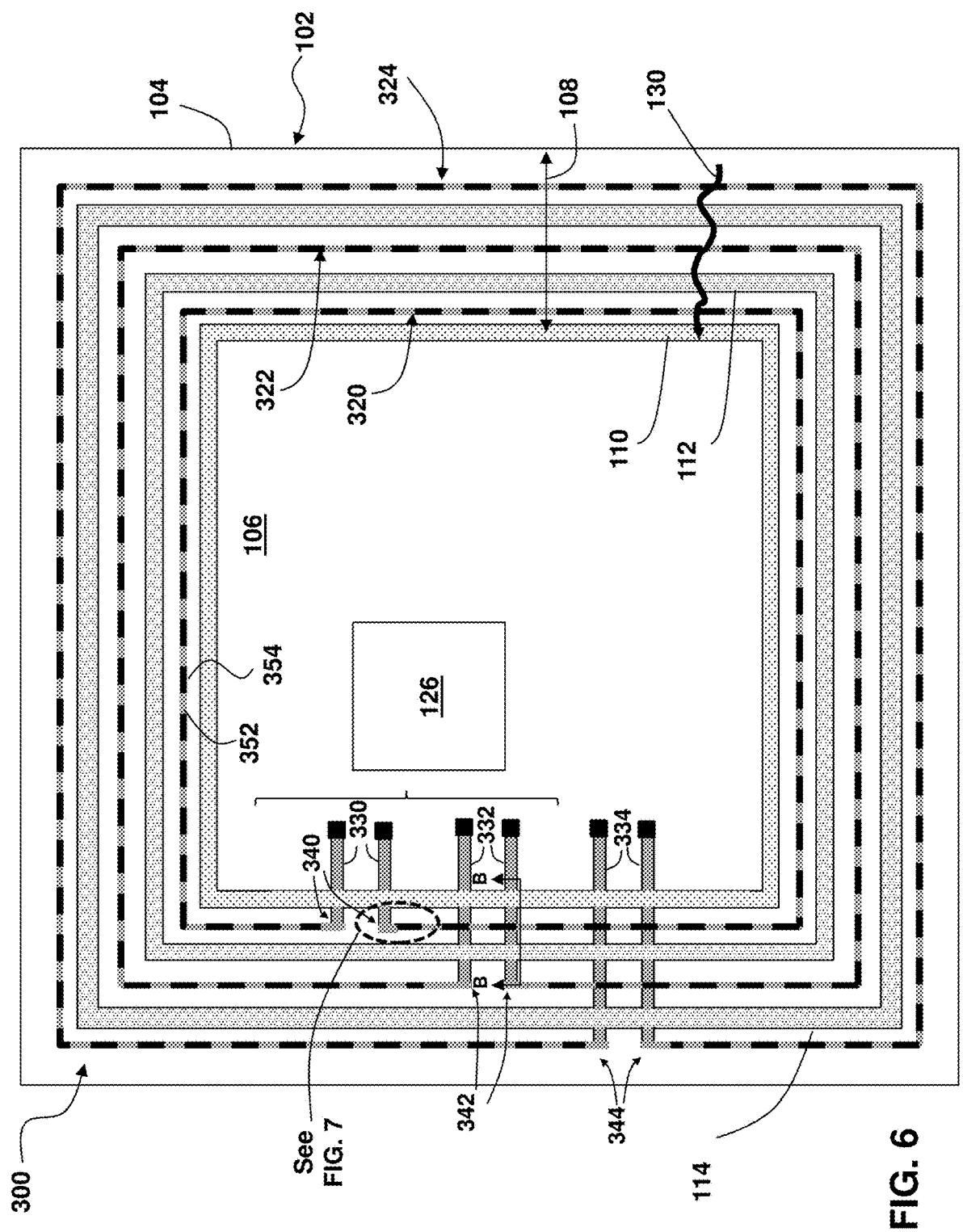
FIG. 6 depicts a plan view of an IC including a system for detecting and monitoring the growth of cracks according to embodiments, where the crack detecting and monitoring system includes PLINEs and tunneling connections.
Figure 7:
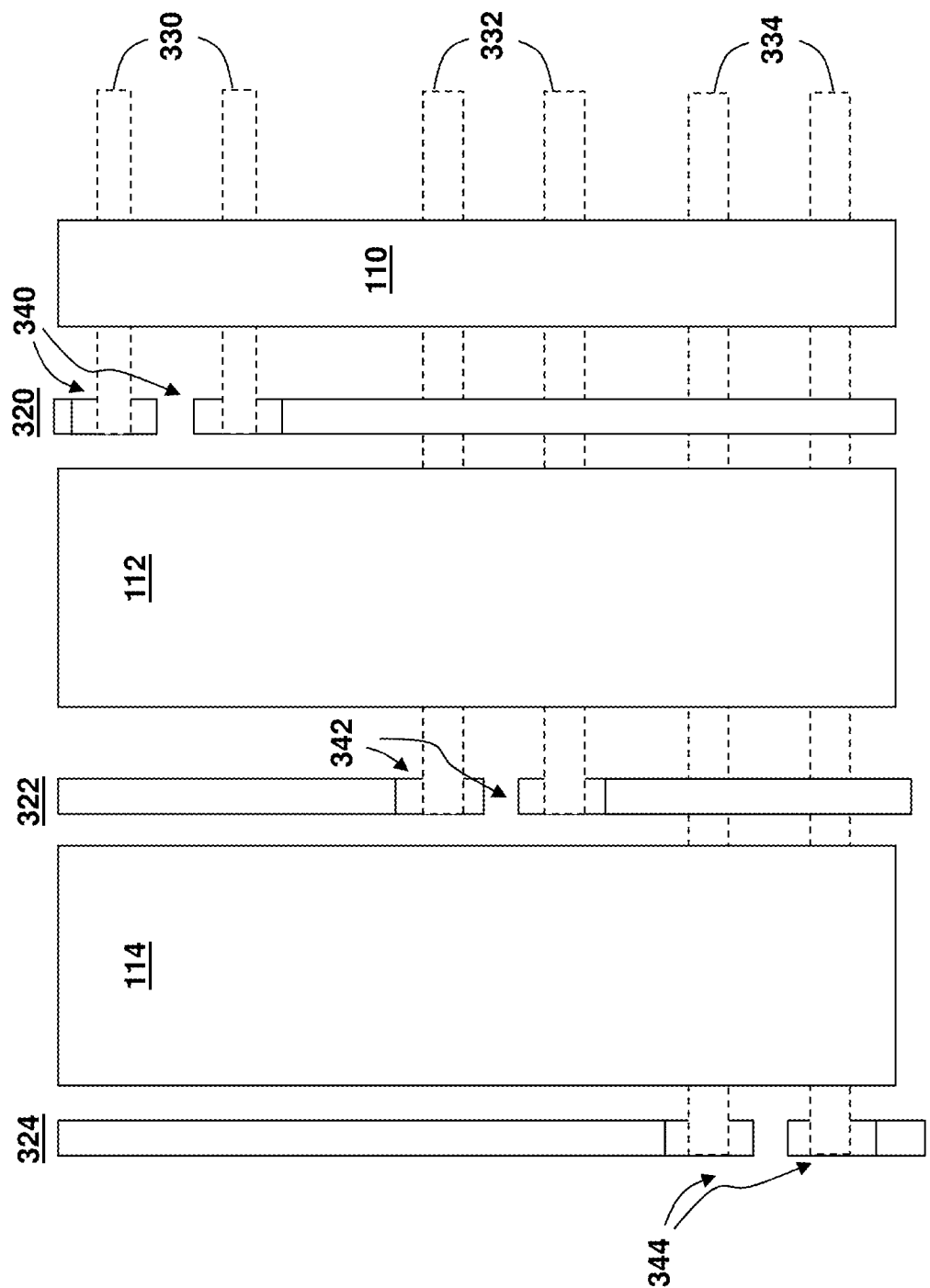
FIG. 7 depicts an enlarged, partial plan view of the IC of FIG. 6 according to embodiments.
Figure 8:
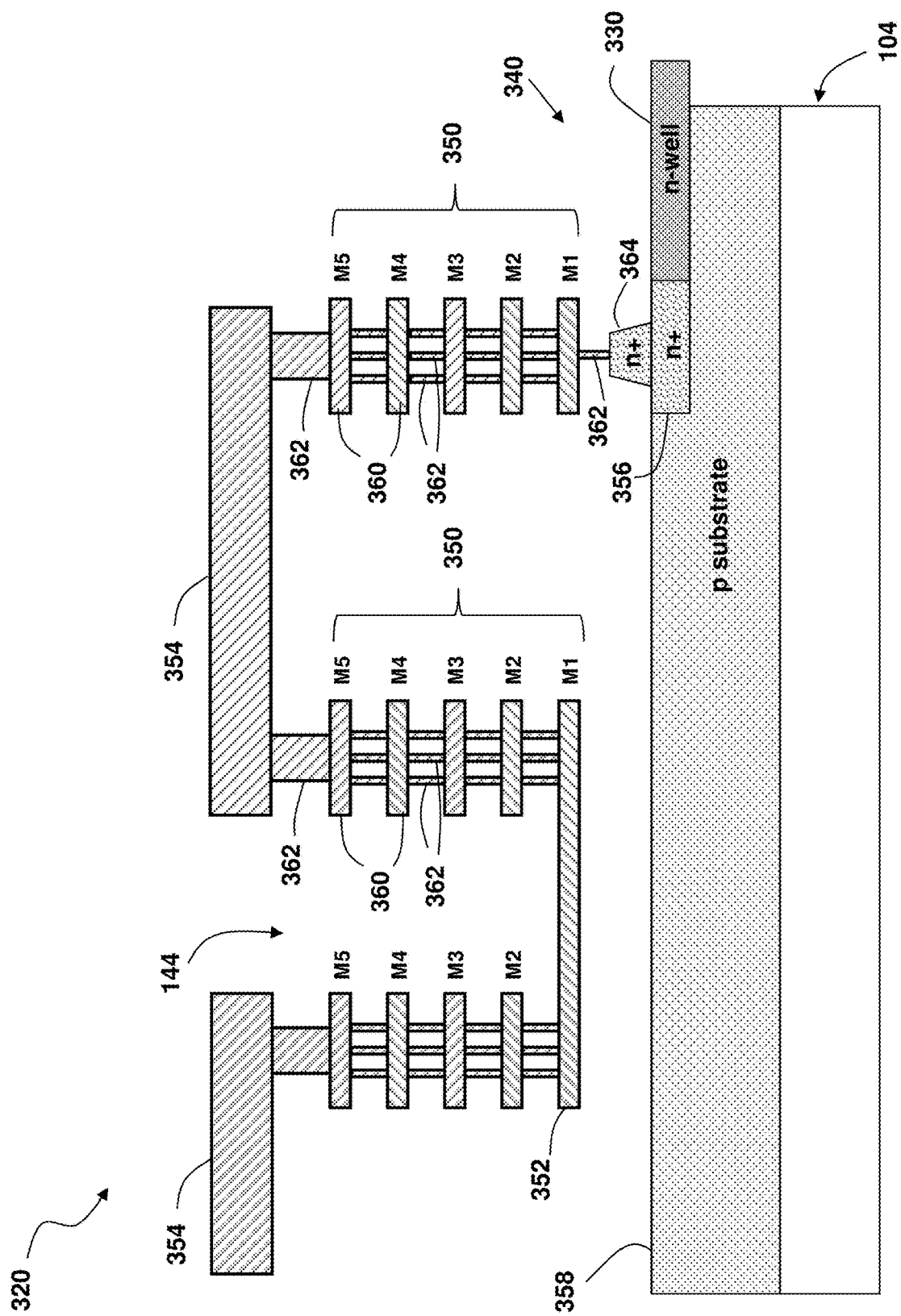
FIG. 8 depicts a partial cross-sectional view of a PLINE in the IC of FIG. 6 according to embodiments.
Figure 9:
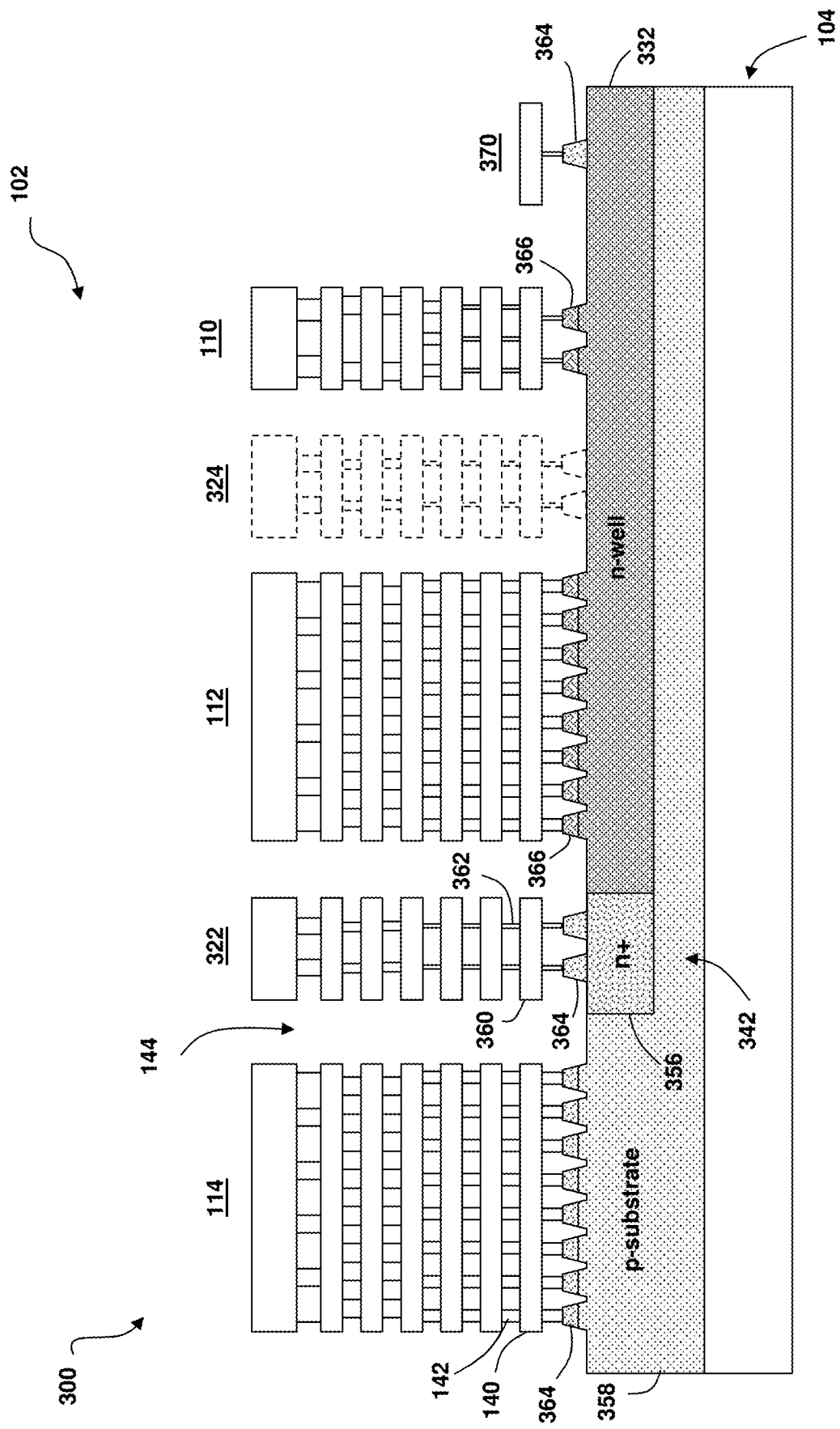
FIG. 9 depicts a partial cross-sectional view of the IC of FIG. 6 taken along line B-B according to embodiments.

As described above, according to embodiments, PLINEs may be coupled to the detection and monitoring circuit 126 via connections that extend over (e.g., straddling connections) or under (tunneling connections) one or more of the guard ring 110, crackstop 112, and crackstop 114. An IC 102 including a crack detecting and monitoring system 300 including tunneling connections according to embodiments is depicted in FIGS. 6-9, referred to concurrently. For example, FIG. 6 depicts a plan view of an IC 102 including a plurality of independent and electrically conductive PLINEs 320, 322, 324 and electrically conductive tunneling connections 330, 332, 334. FIG. 7 depicts an enlarged, partial plan view of the IC 102 of FIG. 6. FIG. 8 depicts a partial cross-sectional view along a length of a PLINE (e.g., PLINE 320) in FIG. 6. FIG. 9 depicts a partial cross-sectional view of the crack detecting and monitoring system 300 taken along line B-B of FIG. 6. Although three PLINEs 320, 322, 324 are utilized in this embodiment, it should be evident that the crack detecting and monitoring system 300 may include a larger or smaller number of PLINEs (e.g., one or more). In addition, PLINEs may be formed in other locations in the inactive region 108 of the IC 102 and/or and a plurality of PLINEs may be formed adjacent to one another in the inactive region 108 of the IC 102.

Similar to the crack detecting and monitoring systems 100, 200 depicted in FIGS. 1 and 3, the crack detecting and monitoring system 300 is configured to detect and monitor the growth of cracks in the inactive region 108 of the IC 102, before any cracks propagate into the active region 106 of the IC 102. In general, the crack detecting and monitoring system 300 may include at least one PLINE formed in the inactive region 108 of the IC 102. For example, as shown in FIG. 6, a first PLINE 320, second PLINE 322, and third PLINE 324 may be formed in the inactive region 108 of the IC 102.

First PLINE 320 may be formed about an outer periphery of the guard ring 110, between the guard ring 110 and the crackstop 112. Second PLINE 322 may be formed about an outer periphery of the crackstop 112, between the crackstop 112 and the crackstop 114. Third PLINE 324 may be formed about an outer periphery of the crackstop 114.

Opposing ends 340 of first PLINE 320 may be coupled via electrically conductive semiconductor tunneling connections 330 to the detection and monitoring circuit 126. The tunneling connections 330 may extend under, and may be electrically isolated from, the guard ring 110. Opposing ends 342 of second PLINE 322 may be coupled via semiconductor tunneling connections 332 to the detection and monitoring circuit 126. As shown, the tunneling connections 332 may extend under, and may be electrically isolated from, the crackstop 112 and the guard ring 110. Opposing ends 344 of third PLINE 324 may be coupled via semiconductor tunneling connections 334 to the detection and monitoring circuit 126. The tunneling connections 334 may extend under, and may be electrically isolated from, the crackstop 114, the crackstop 112, and the guard ring 110. According to embodiments, the tunneling connections 344 may also be electrically isolated from PLINEs 320, 322 and the tunneling connections 342 may also be electrically isolated from PLINE 320. As described hereinafter, the tunneling connections 340, 342, 344 may be formed using doped regions of the substrate 104 of the IC 102.

A cross-sectional view along an end portion of PLINE 320 of FIG. 6 according to embodiments is depicted in FIG. 8. PLINEs 322 and 324 may each have a similar or different configuration than PLINE 320. As shown, PLINE 320 may include a plurality of electrically conductive metal sections 350 that may be daisy-chained together by an alternating sequence of electrically conductive lower metal connectors 352 (only one shown) and electrically conductive upper metal connectors 354. The metal connectors 352, 354 may have similar or different lengths. The lengths of the metal connectors 352, 354 may affect the crack detection accuracy of PLINE 320. For example, a larger number (e.g., higher density) of metal sections 350 may be daisy-chained together when using shorter metal connectors 352, 354. In general, the minimum lengths of the metal connectors 352, 354 may be governed by the processing rules used to form the IC 102. For example, the lithography tools used to fabricate the metal connectors 352, 354 in respective metallization layers of the IC 102 may only be capable of producing metal lines having a certain minimum length in a particular dielectric layer. According to embodiments, the lower metal connectors 352 may be formed, for example, in a lower BEOL metallization layer of the IC 102 (e.g., M1 metallization layer as shown). The upper metal connectors 354 may be formed in an upper metallization layer of the IC 102. According to embodiments, the lengths of the metal connectors 352, 354 may be, for example, in the range of tens of nanometers to several microns (e.g., depending on manufacturing limitations and/or other factors).

The metal sections 350 may include a plurality of layers of electrically conductive metal segments 360 interconnected by a plurality of electrically conductive metal interconnects 362 (e.g., vias, viabars, etc.) and embedded in a dielectric material 144. The metal segments 362 may be formed in metallization layers of the IC 102 (e.g., BEOL metallization layers M1-M5 as shown). One or more metal interconnects 362 may also be used to couple adjacent metal sections 350 to respective upper metal connectors 352. The lowermost metal segment 360 (e.g., M1 metallization layer) of at least one of the metal sections 350 may be coupled to a doped region 356 of the semiconductor substrate 104 by at least one metal interconnect 362 and doped semiconductor interconnect 364.

As depicted in FIG. 8, the doped semiconductor region 356 may be formed in a doped portion 358 of the semiconductor substrate 104 of the IC 102. At least one doped semiconductor interconnect 364 may be formed over the doped semiconductor region 356 to couple a metal section 350 located at an end 340 of PLINE 320 to a tunneling connection 330 which, in this embodiment, is formed by a doped semiconductor well formed in the doped portion 358 of the semiconductor substrate 104. The metal section 350 may be coupled to the doped semiconductor interconnect 364 using one or more metal interconnects 362. The doping of the semiconductor region 356, the semiconductor interconnect 364, and the tunneling connection 330 allows the passage of an electrical signal when measuring the electrical characteristic (e.g., resistance) of PLINE 320. The semiconductor region 356 and the semiconductor interconnect 364 may be n$^+$-doped as shown in FIG. 8 or p$^+$-doped in other embodiments. Doping may be provided, for example, using ion implantation or any other suitable process.

When using an n$^+$-doped semiconductor region 356 (with an n$^+$-doped semiconductor interconnect 364) as depicted in FIG. 8, the n$^+$-doped semiconductor region 356 may be formed in a p-doped region 358 of the semiconductor substrate 104 of the IC 102. As further illustrated in FIG. 8, in this doping scheme, the n$^+$-doped semiconductor region 356 located adjacent an end 340 of PLINE 320 may be coupled to the detection and monitoring circuit 126 via a tunneling connection 330 formed using an n-doped semiconductor well (n-doped well) formed in the p-doped region 358 of the semiconductor substrate 104 of the IC 102.

According to other embodiments, a p$^+$-doped semiconductor region and a p$^+$-doped semiconductor interconnect may be used in lieu of the n$^+$-doped semiconductor region 356 and the n$^+$-doped semiconductor interconnect 364. The p$^+$-doped semiconductor region may be formed in an n$^+$-doped region of the semiconductor substrate 104 of the IC 102. In addition, the p$^+$-doped semiconductor region located adjacent the end 340 of PLINE 320 may be coupled to the detection and monitoring circuit 126 via a p-doped semiconductor well tunneling connection 330 formed in the n-doped region of the substrate 104 of the IC 102.

FIG. 9 depicts a partial cross-sectional view of the IC 102 taken along line B-B of FIG. 6 according to embodiments. As shown, an n-doped semiconductor well tunneling connection 332 (hereafter n-doped tunneling connection 332) may be formed in the p-doped region 358 of the substrate 104 of the IC 102 to couple the n$^+$-doped semiconductor region 356 adjacent an end 342 of PLINE 322 to the detection and monitoring circuit 126 via an I/O connection 370. PLINE 322 may be coupled to the n$^+$-doped semiconductor region 356 by at least one n$^+$-doped semiconductor interconnect 364. At least one n$^+$-doped semiconductor interconnect 364 may also be used to couple the n-doped tunneling connection 332 to the I/O connection 370.

The crackstop 114 may be positioned over the p-doped region 358 of the semiconductor substrate 104. The crackstop 114 may be coupled to the p-doped region 358 using at least one n$^+$-doped semiconductor interconnect 364. A bias applied to the p-doped region 358 may be used to reverse bias the pn junction(s) formed between the p-doped region 358 and the at least one n$^+$-doped semiconductor interconnect 364 to electrically isolate the crackstop 114 from the p-doped region 358.

The n-doped tunneling connection 332 extends beneath and is electrically isolated from the crackstop 112 and the guard ring 110. The crackstop 112 may be coupled to the n-doped tunneling connection 332 using at least one p$^+$-doped semiconductor interconnect 366. Similarly, the guard ring 110 may be coupled to the n-doped tunneling connection 332 using at least one p$^+$-doped semiconductor interconnect 366. The reverse biased pn junctions formed between the p$^+$-doped semiconductor interconnect(s) 366 and the n-doped tunneling connection 332 electrically isolate the crackstop 112 and the guard ring 110 from the n-doped tunneling connection 332.

According to other embodiments, any of the crack detecting and monitoring systems described herein may utilize both types of connecting structures to electrically connect PLINEs to the detection and monitoring circuit 126. For example, a first PLINE in a crack detecting and monitoring system may be electrically connected to the detection and monitoring circuit 126 using metal straddling connectors, a second PLINE in the same crack detecting and monitoring system may be electrically connected to the detection and monitoring circuit 126 using doped semiconductor tunneling connectors, while a third PLINE in the same crack detecting and monitoring system may be connected using both straddling and tunneling connectors.

Figure 10:
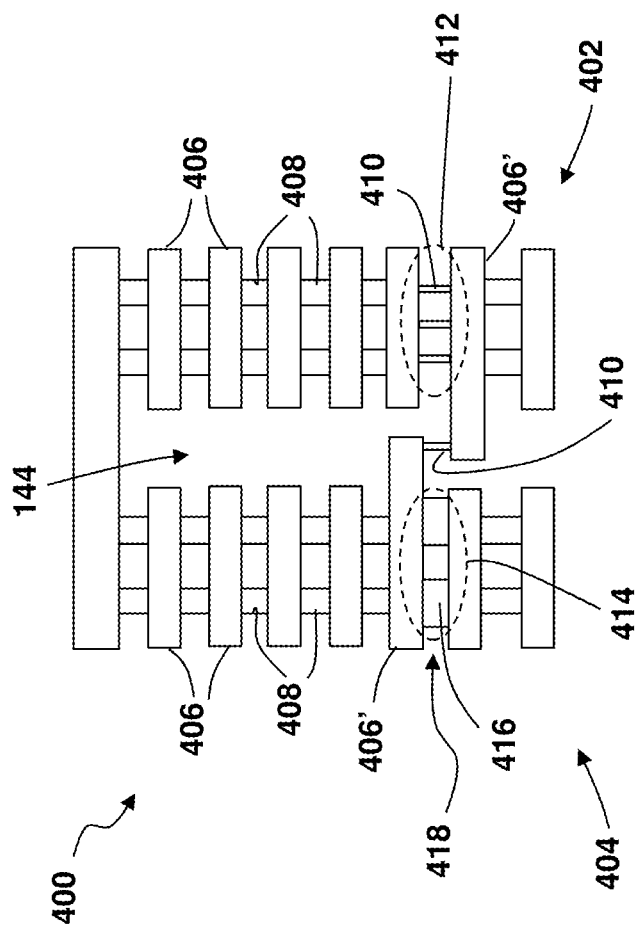
FIG. 10 depicts a cross-sectional view of a PLINE for directing and trapping a propagating crack according to embodiments.

Any/all PLINEs described herein can be configured to direct and trap a crack propagating through the inactive region 108 of an IC 102. For example, a cross-sectional view of a PLINE 400 according to embodiments for directing and trapping a crack is depicted in FIG. 10. As shown, PLINE 400 includes first and second electrically conductive interconnected metal sections 402, 404. The metal section 404 may include a plurality of layers of electrically conductive metal segments 406 interconnected using a high density arrangement of electrically conductive metal interconnects 408 (e.g., vias, viabars, etc.) and embedded in a dielectric material 144. The metal section 402 may also include a plurality of layers of electrically conductive metal segments 406 interconnected using a high density arrangement of the metal interconnects 408 and embedded in a dielectric material 144. In addition, a plurality (2 in this example) of the metal segments 406 in the metal section 402 may be interconnected using a low density arrangement of electrically conductive metal interconnects 410 (e.g., vias, viabars, etc.). The metal interconnects 410 form a weakened area 412 in the metal section 402 that effectively attracts a crack propagating toward PLINE 400. An elongated metal segment 406' in the metal section 402 may also be coupled to an elongated metal segment 406' in the metal section 404 by a metal interconnect 410. The metal section 404 may further include a trapping area 414 that has been reinforced in order to trap/slow a crack after it has propagated through the weakened area 412 in the metal section 402. The trapping area 414 may be reinforced, for example, by providing a set of larger/stronger metal interconnects 416 (e.g., wider/thicker than the metal interconnects 408) and/or by embedding the set of metal interconnects 416 (or even the entire metal section 404) in a stronger dielectric material 418 that is less susceptible to cracking (e.g., compared to the dielectric material 144).

According to embodiments, the high density arrangement of metal interconnects 408 and the low density arrangement of metal interconnects 410 may be provided in several different ways. For example, the metal interconnects 408, 410 may arranged in the same pattern, but the metal interconnects 408 may be thicker than the metal interconnects 410. As another example, the metal interconnects 408, 410 may have the same thicknesses, but the metal interconnects 408 may be arranged closer together than the metal interconnects 410.

Figure 11A:
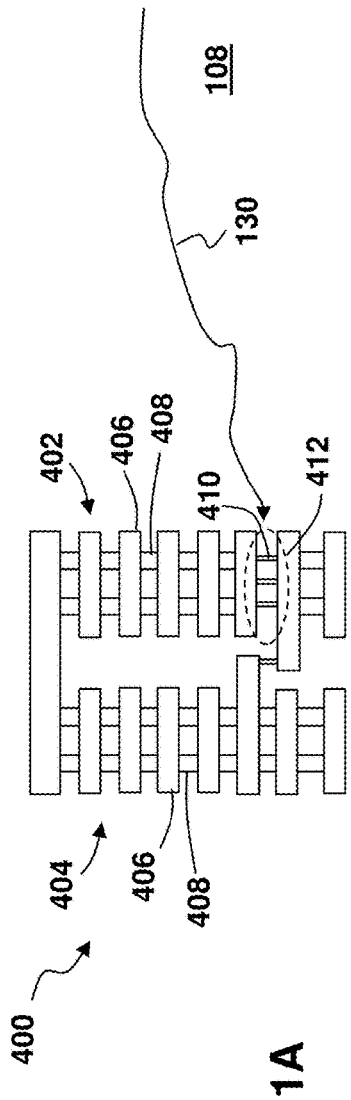
FIGS. 11A, 11B, and 11C depict an example of the crack directing and trapping function of the PLINE of FIG. 10 according to embodiments.
Figure 11B:
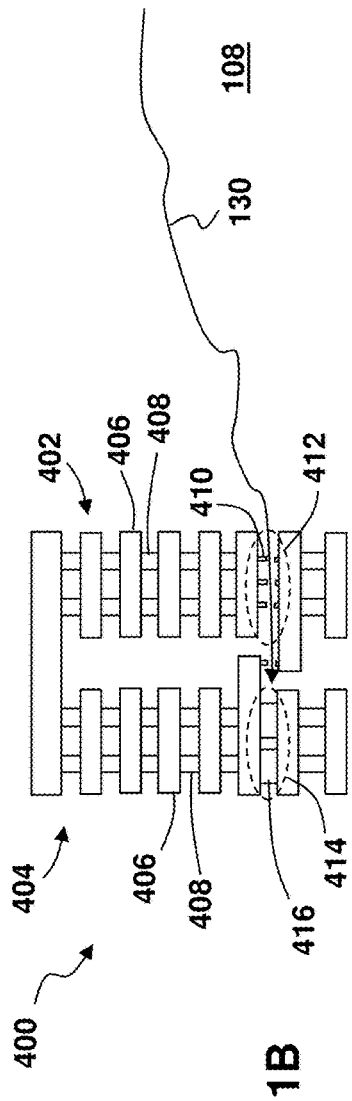
Figure 11C:
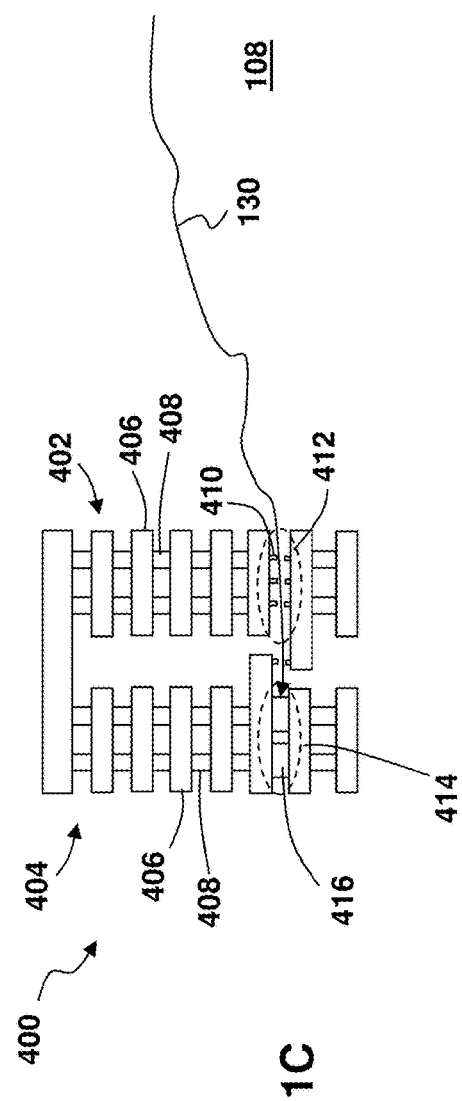

FIGS. 11A, 11B, and 11C depict an example of the crack directing and trapping function of PLINE 400 of FIG. 10 according to embodiments. In FIG. 11A, a crack 130 propagating through the inactive region 108 of an IC is attracted toward the weakened area 412 provided by the metal interconnects 410 in the metal section 402. In FIG. 11B, the crack 130 passes through the low density arrangement of metal interconnects 410 in the metal section 402 toward the trapping area 414. In FIG. 11C, the crack is trapped/slowed, and its energy is dispersed, by the metal interconnects 416 in the trapping area 414. The break in the metal section 402 results in an increase in the resistance of PLINE 400, which is sensed by the determined by the detecting and monitoring circuit 126. If a trapping area 414 is not used, the crack 130 may be trapped/slowed by the high density arrangement of the metal interconnects 408 in the metal section 404.

Figure 12:
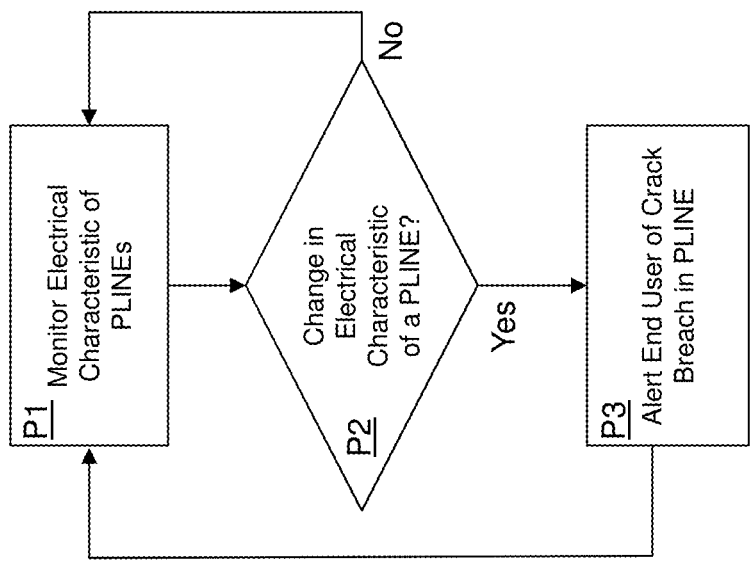
FIG. 12 depicts a flow diagram of a process for detecting and monitoring cracks in an IC according to embodiments.

A flow diagram of a process for detecting and monitoring cracks in an IC according to embodiments is depicted in FIG. 12. At process A1, an electrical characteristic (e.g., resistance) of a plurality of PLINEs positioned in an inactive region of an IC is monitored (continuously or periodically) by a detection and monitoring circuit. If the detection and monitoring circuit senses a change in the electrical characteristic of a PLINE, indicating that a crack has propagated into/through the PLINE (Yes at process P2), flow passes to process P3. Otherwise (No at process P2), flow passes back to process P1.

At process P3, the detection and monitoring circuit provides an alert (e.g., email, text message, system message, and/or the like) to an end user indicating that a crack breach has occurred at the PLINE. The nature of the alert may depend, for example, on the location of the PLINE in the inactive area of the IC (e.g., the closer the PLINE is to the active area of the IC, the stronger the alert). Flow then passes back to process P1.

Figure 13:
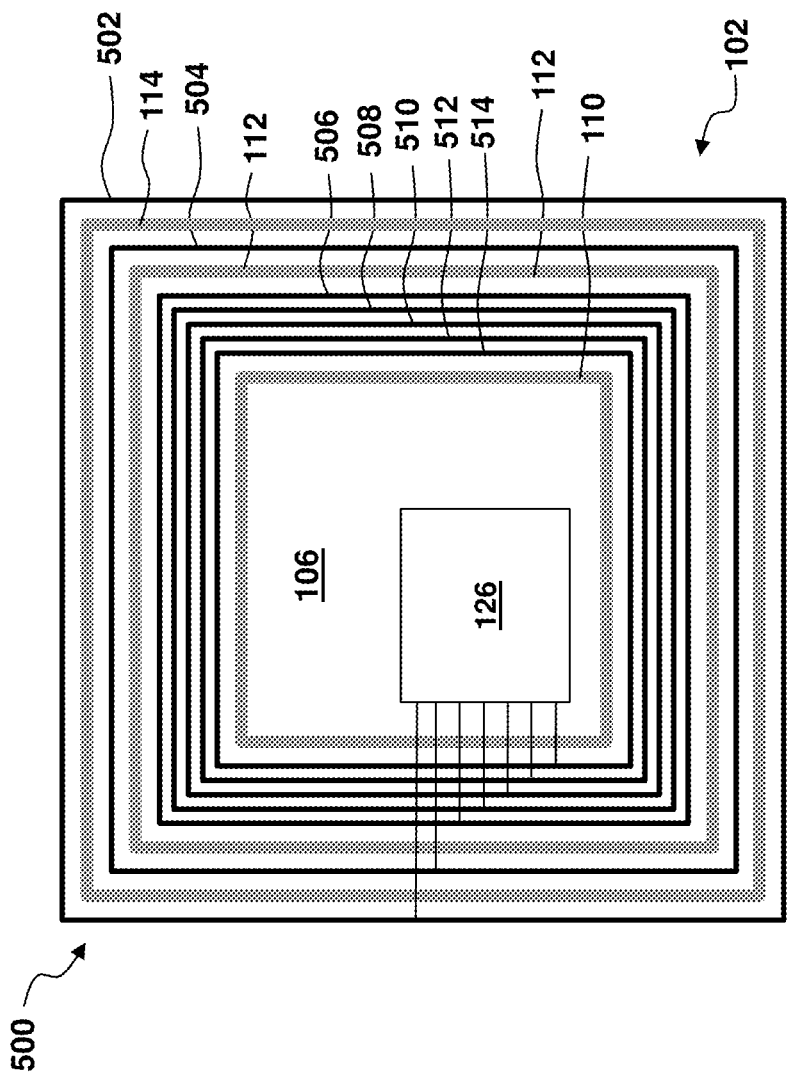
FIG. 13 depicts a plan view of an IC including a crack detecting and monitoring system according to other embodiments.

FIG. 13 depicts a plan view of an IC 102 including a crack detecting and monitoring system 500 according to other embodiments. Similar to the crack detecting and monitoring systems 100, 200, 300, the crack detecting and monitoring system 500 may include an electrically conductive PLINE 502 formed about an outer periphery of the crackstop 114 and an electrically conductive PLINE 504 formed about an outer periphery of the crackstop 112, between the crackstop 112 and the crackstop 114. However, unlike the crack detecting and monitoring systems 100, 200, 300, the crack detecting and monitoring system 500 may include a plurality (e.g., >2) of adjacent, electrically conductive PLINEs formed about an outer periphery of the crackstop 110, between the crackstop 110 and the crackstop 112. For example, as depicted in FIG. 13, five PLINEs 506, 508, 510, 512, 514 may be provided between the crackstop 110 and the crackstop 112. Each PLINE 502, 504, 506, 508, 510, 512, 514 may be coupled to the detection and monitoring circuit 126 via respective straddling or tunneling connections.

In operation, the detection and monitoring circuit 126 may be configured to provide a first type of alert when a crack propagates into/through PLINEs 502, 504, and a second type of alert when a crack propagates into/through PLINEs 506, 508, 510, 512, 514. For example, the detection and monitoring circuit 126 may be configured to provide initial alerts to an end user when a crack propagates into/through PLINEs 502, 504. Such alerts may include, for example, "A crack breach has occurred in the IC," and "A crack continues to propagate toward the interior of the ICs.

The crack detecting and monitoring system 500 may be further configured to provide aging information regarding the expected remaining lifetime (e.g., approximate time to failure) of the IC 102 when a crack propagates into/through PLINEs 506, 508, 510, 512, 514. To achieve this functionality, the growth rate of a crack may be determined in a test IC 102. Based on the growth rate, PLINEs 506, 508, 510, 512, 514 may be spaced at specific distances from active region 106 of an IC 102, where each distances is representative of a different remaining operational lifetime of the IC 102. When a crack propagates into/through a given PLINE, the detection and monitoring circuit 126 may alert an end user that a crack has reached that PLINE and that if conditions remain the same, the crack may reach the active region of the IC 102 in a certain number of days/months/years (e.g., 18 months). Alerts may include, for example, "A crack is approaching the active area of the IC. The IC is expected to fail in approximately 18 months." When a crack propagates into/through another PLINE that is closer to the active region 106 of the IC 102, the detection and monitoring circuit 126 may alert an end user that a crack has reached that PLINE and that if conditions remain the same, the crack may reach the active region 106 of the IC 102 in a certain number of days/months/years (e.g., 12 months).

A detection and monitoring circuit 600 according to embodiments is depicted in FIG. 14. As shown, a known test current $I_{Test}$ may be injected into a PLINE 602. PLINE 602 has a low resistance when intact and a much higher resistance when broken. A voltage sensing circuit 604 may be configured to compare the voltage $V_{PLINE}$ of PLINE 602 against a reference voltage $V_{REF}$ and to output a logical 1 or 0 based on the integrity (intact or broken) of PLINE 602. When PLINE 602 is intact, the voltage $V_{PLINE}$ of PLINE 602 is lower than the reference voltage $V_{REF}$. When PLINE 602 is broken, the voltage $V_{PLINE}$ of PLINE 602 is higher than the reference voltage $V_{REF}$. The sensing circuit 604 may include, for example, a comparator or other suitable voltage sensing circuit.

A detection and monitoring circuit 700 according to additional embodiments is depicted in FIG. 15. As shown, the detection and monitoring circuit 700 may include a voltage divider 702 that uses a PLINE 704 as a resistor with an unknown resistance (low (intact) or high (broken)). A voltage sensing circuit 706 may be configured to compare the voltage $V_{PLINE}$ of PLINE 704 against a reference voltage $V_{REF}$ and to output a logical 1 or 0 based on the integrity (intact or broken) of PLINE 704. When PLINE 704 is intact, the voltage $V_{PLINE}$ of PLINE 704 is lower than the reference voltage $V_{REF}$. When PLINE 704 is broken, the voltage $V_{PLINE}$ of PLINE 704 is higher than the reference voltage $V_{REF}$. The sensing circuit 706 may include, for example, a comparator or other suitable voltage sensing circuit.

Embodiments of the disclosure may provide several technical and commercial advantages, some of which here discussed herein by way of example. The crack detecting and monitoring systems disclosed herein are configured to detect the presence of a crack in an inactive region of an IC and to alert an end user of the presence of the crack and its growth progression towards the active region of the IC. In addition, the crack detecting and monitoring systems disclosed herein are designed to warn an end user of an impending catastrophic failure before it becomes an actual catastrophic failure where a crack propagates into the active region of the IC. This allows an end user to replace an IC before it fails due to crack propagation. The crack detecting and monitoring systems can be arranged and calibrated in a manner to provide an approximate time frame to imminent failure of an IC.

The crack detecting and monitoring systems disclosed herein include straddling or tunneling connections to a detecting and monitoring circuit that circumvent and traverse crackstop(s) and/or guard rail(s) through either the top metal levels (BEOL) or via buried semiconductor wells in a semiconductor substrate of an IC. The crack detecting and monitoring systems disclosed herein may also include purposely designed weak points that that will guide crack growth to desired locations where a crack will be trapped and its energy dispersed.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A system for detecting and monitoring a crack in an integrated circuit (IC), comprising:
   at least one electrically conductive perimeter line (PLINE) extending about, and electrically isolated from, a protective structure formed in an inactive region of the IC, wherein an active region of the IC is enclosed within the protective structure;
   a circuit for sensing a change in an electrical characteristic of the at least one PLINE, the change in the electrical characteristic indicating a presence of a crack in the inactive region of the IC; and
   a connecting structure for electrically coupling each PLINE to the sensing circuit.

2. The system according to claim 1, wherein the sensing circuit is configured to provide an alert in response to a sensed change in the electrical characteristic of the at least one PLINE.

3. The system according to claim 2, wherein the alert provided in response to a sensed change in the electrical characteristic of the at least one PLINE indicates that the crack has propagated through the at least one PLINE toward the active region of the IC, wherein the alert is provided before the crack has propagated into the active region of the IC.

4. The system according to claim 2, wherein the alert provided in response to a sensed change in the electrical characteristic of the at least one PLINE indicates an estimated time of failure of the IC.

5. The system according to claim 1, wherein the electrical characteristic comprises a resistance of the at least one PLINE.

6. The system according to claim 1, wherein the protective structure of the IC comprises a crackstop or a guard ring.

7. The system according to claim 1, wherein the connecting structure further comprises:
   at least one electrically conductive straddling connector extending over, and electrically isolated from, the protective structure of the IC.

8. The system according to claim 7, wherein the at least one PLINE further comprises a plurality of electrically conductive sections connected together by an alternating sequence of lower and upper electrically conductive connectors, and wherein each electrically conductive section of the at least one PLINE further comprises:
   a plurality of layers of electrically conductive metal segments; and
   a plurality of electrically conductive interconnects for interconnecting the plurality of layers of electrically conductive metal segments.

9. The system according to claim 8, wherein the alternating sequence of lower and upper electrically conductive connectors comprises a lower metal connector and an upper metal connector.

10. The system according to claim 1, wherein the connecting structure further comprises:
    at least one electrically conductive tunneling connector extending under, and electrically isolated from, the protective structure of the IC.

11. The system according to claim 10, wherein the at least one PLINE further comprises a plurality of electrically conductive sections connected together by an alternating sequence of lower and upper electrically conductive connectors, and wherein each electrically conductive section of the at least one PLINE further comprises:
    a plurality of layers of electrically conductive metal segments; and
    a plurality of electrically conductive interconnects for interconnecting the plurality of layers of electrically conductive metal segments.

12. The system according to claim 11, wherein the alternating sequence of lower and upper electrically conductive connectors further comprises a doped semiconductor region formed in a semiconductor substrate of the IC.

13. The system according to claim 10, wherein the electrically conductive tunneling connector comprises a doped semiconductor well formed in a semiconductor substrate of the IC.

14. The system according to claim 1, wherein the IC includes a plurality of protective structures, the system further comprising a plurality of the PLINEs, wherein each PLINE extends about a perimeter of a respective protective structure.

15. The system according to claim 1, wherein at least one of the PLINEs includes a structure including a weakened area for directing the crack toward a reinforced area configured to trap the crack.

16. A method for detecting and monitoring a crack in an integrated circuit (IC), comprising:
    forming at least one electrically conductive perimeter line (PLINE) around a protective structure formed in an inactive region of the IC, wherein an active region of the IC is enclosed within the protective structure;
    monitoring an electrical characteristic of the at least one PLINE, wherein a change in the electrical characteristic indicates a presence of a crack in the inactive region of the IC, and wherein the electrical characteristic of the at least one PLINE is monitored by a circuit on the IC; and
    providing an alert in response to the sensed change in the electrical characteristic of the at least one PLINE, wherein the alert is generated by a circuit on the IC.

17. The method according to claim 16, wherein the alert is provided before the crack has propagated into the active region of the IC.

18. The method according to claim 16, further comprising:
- determining a growth rate of the crack in the IC in a stable environment; and
- positioning each PLINE at a specific distance from the active region based on the growth rate of the crack, where the distance is calibrated to a remaining operational lifetime of the IC;
- wherein the alert indicates an estimated time of failure of the IC.

19. The method according to claim 16, further comprising providing the at least one PLINE with a weakened area for attracting the crack and a reinforced area for trapping the crack.

20. A system for detecting and monitoring a crack in an integrated circuit (IC), comprising:
- at least one electrically conductive perimeter line (PLINE) extending about, and electrically isolated from, a protective structure formed in an inactive region of the IC, wherein an active region of the IC is enclosed within the protective structure;
- a circuit for sensing a change in an electrical characteristic of the at least one PLINE, the change in the electrical characteristic indicating a presence of a crack in the inactive region of the IC; and
- a connecting structure for electrically coupling each PLINE to the sensing circuit, wherein the connecting structure further comprises at least one of a:
  - metal straddling connector extending over, and electrically isolated from, the protective structure of the IC; and
  - a doped semiconductor tunneling connector extending under, and electrically isolated from, the protective structure of the IC.

\* \* \* \* \*